United States Patent [19]

Kaufman

[11] Patent Number: 4,902,854

[45] Date of Patent: Feb. 20, 1990

[54] HERMETIC DIRECT BOND CIRCUIT ASSEMBLY

[76] Inventor: Lance R. Kaufman, 131 North White Oak Way, Mequon, Wis. 53092

[21] Appl. No.: 180,476

[22] Filed: Apr. 12, 1988

[51] Int. Cl.⁴ .......................................... H01L 23/02
[52] U.S. Cl. ..................... 174/52.4; 357/74
[58] Field of Search ............... 174/52 FP; 357/70, 74

[56] References Cited

U.S. PATENT DOCUMENTS

| | | | |
|---|---|---|---|
| 3,744,120 | 7/1973 | Burgess et al. | 29/494 |
| 3,766,634 | 10/1973 | Babcock et al. | 29/471.9 |
| 3,854,892 | 11/1974 | Burgess et al. | 29/196.1 |
| 3,911,553 | 10/1975 | Burgess et al. | 228/173 |
| 3,958,075 | 5/1976 | Kaufman | 174/16 HS |
| 3,993,411 | 11/1976 | Babcock et al. | 403/271 |
| 3,994,430 | 11/1976 | Cusano et al. | 228/122 |
| 4,129,243 | 12/1978 | Cusano et al. | 228/122 |
| 4,156,148 | 5/1979 | Kaufman | 250/551 |
| 4,196,411 | 4/1980 | Kaufman | 338/314 |
| 4,215,235 | 7/1980 | Kaufman | 174/52 PE |
| 4,218,724 | 8/1980 | Kaufman | 361/395 |
| 4,250,481 | 2/1981 | Kaufman | 338/163 |
| 4,266,140 | 5/1981 | Kaufman | 250/551 |
| 4,394,530 | 7/1983 | Kaufman | 174/16 HS |
| 4,449,165 | 5/1984 | Kaufman | 361/386 |
| 4,449,292 | 5/1984 | Kaufman | 29/631 |
| 4,488,202 | 12/1984 | Kaufman | 361/386 |
| 4,498,120 | 2/1985 | Kaufman | 361/386 |
| 4,546,410 | 10/1985 | Kaufman | 361/387 |
| 4,546,411 | 10/1985 | Kaufman | 361/387 |
| 4,554,613 | 11/1985 | Kaufman | 361/386 |
| 4,574,162 | 3/1986 | Kaufman | 174/16 HS |
| 4,577,387 | 3/1986 | Kaufman | 29/458 |
| 4,630,174 | 12/1986 | Kaufman | 361/388 |
| 4,700,273 | 10/1987 | Kaufman | 361/388 |
| 4,713,723 | 12/1987 | Kaufman | 361/179 |
| 4,724,514 | 2/1988 | Kaufman | 361/388 |
| 4,736,520 | 4/1988 | Morris | 174/52 FP |

OTHER PUBLICATIONS

"Over 50 Years of Experience with the Direct Bond Copper Process", Tegmen Corp., 1201 East Fayette St., Syracuse, N.Y. 13210.

Primary Examiner—Leo P. Picard
Assistant Examiner—David A. Tone
Attorney, Agent, or Firm—Andrus, Sceales, Starke & Sawall

[57] ABSTRACT

An electric circuit assembly (12) includes a ceramic tub (14) having a floor (16) and an integral side wall (18) around the perimeter thereof and extending upwardly therefrom. Copper lead frames (20, 22, 24), are directly and hermetically bonded to the bottom of the tub floor at apertures (40, 42, 44) therethrough. A semiconductor chip (38) is connected to the lead frames through the apertures in the floor of the tub. A top cover (36) is hermetically sealed to the top (32) of the side wall of the tub to close the tub and hermetically seal the semiconductor chip therein. A first copper ring (30) is directly bonded to the top of the side wall of the tub and a second copper ring (34) is directly bonded to the underside of the ceramic top cover, and the rings are subsequently welded to each other.

14 Claims, 4 Drawing Sheets

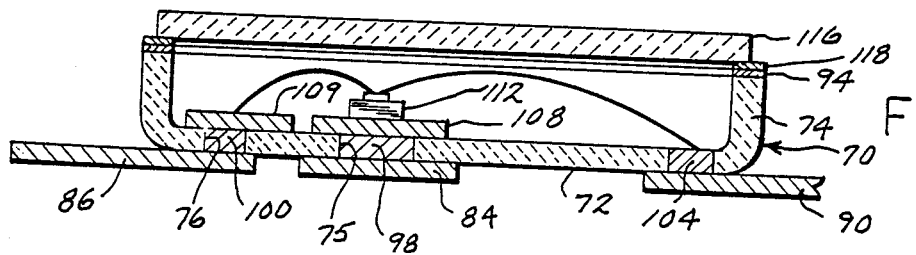
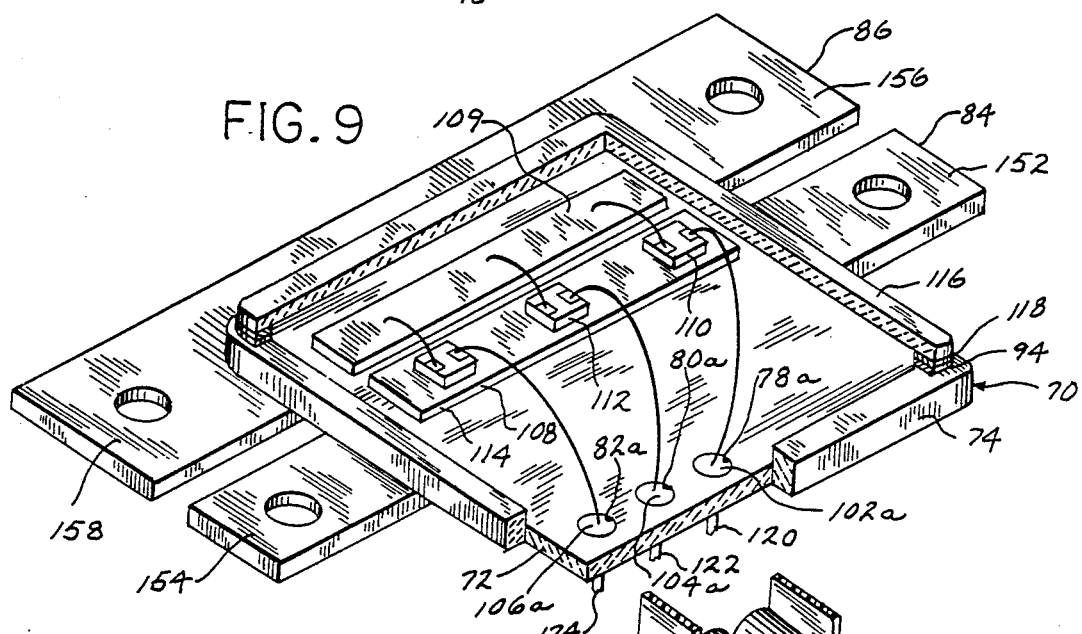
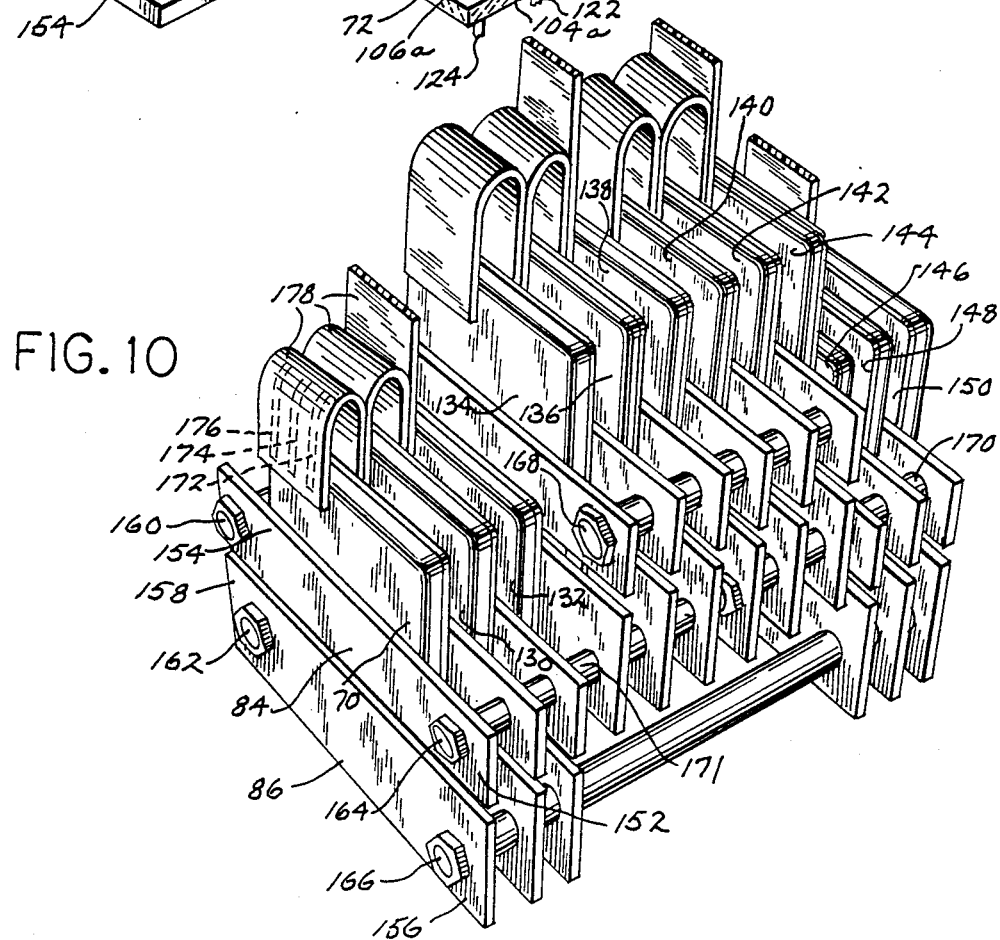

HERMETIC DIRECT BOND CIRCUIT ASSEMBLY

BACKGROUND AND SUMMARY

The invention relates to a direct bond electric circuit assembly, and more particularly to an improved assembly structure and manufacturing method providing hermetic sealing in combination.

Electric circuit assemblies in the field of the present invention typically include an electrically insulating thermally conductive non-metallic refractory substrate, e.g. ceramic, having electrically conductive metallic lead frames, e.g. copper, mounted on the substrate, and electrical components, e.g. semiconductor chips, mounted on the lead frames. The structure is covered by an insulating housing which in turn is mounted to a heat sink such that the bottom surface of the ceramic substrate is in intimate contact with the heat sink. Examples of such circuit assemblies are shown in U.S. Pat. Nos. 3,958,075, 4,156,148, 4,196,411, 4,215,235, 4,218,724, 4,250,481, 4,266,140, 4,394,530, 4,449,165, 4,449,292, 4,488,202, 4,498,120, 4,546,410, 4,546,411, 4,554,613, 4,574,162, 4,577,387, 4,630,174, 4,700,273, 4,713,723, 4,724,514.

The copper lead frames are mounted to the ceramic in various manners, for example by a solder reflow operation, or by a direct bond operation, both of which processes are known in the art.

Direct bonding of the copper to the ceramic involves placing the lead frame in contact with the ceramic, heating the lead frame and the ceramic substrate to a temperature below the melting point of the lead frame to form a eutectic with the lead frame which wets the lead frame and the ceramic substrate, and cooling the lead frame and the substrate with the lead frame bonded to the substrate. The lead frame is per-oxidized, and the heating is done in an inert atmosphere, or alternatively the heating is done in a reactive oxygen gas atmosphere. The direct bond process is disclosed in U.S. Pat. Nos. 3,744,120, 3,766,634, 3,854,892, 3,911,553, 3,993,411, 3,994,430, 4,129,243, and further reference may be had to "Over 50 years of experience with the Direct Bond Copper Process", Tegmen Corp., 1201 East Fayette Street, Syracuse, New York.

The present invention uses direct bond processing and provides a simple and effective hermetic sealed circuit package.

BRIEF DESCRIPTION OF THE DRAWINGS

FIG. 8 is a sectional view of the assembled structure of FIG. 5.

FIG. 9 is a perspective assembled view of structure similar to FIG. 5 and with further modifications.

FIG. 10 is a perspective view of a further electric circuit assembly in accordance with the invention.

DETAILED DESCRIPTION

Figure 1:
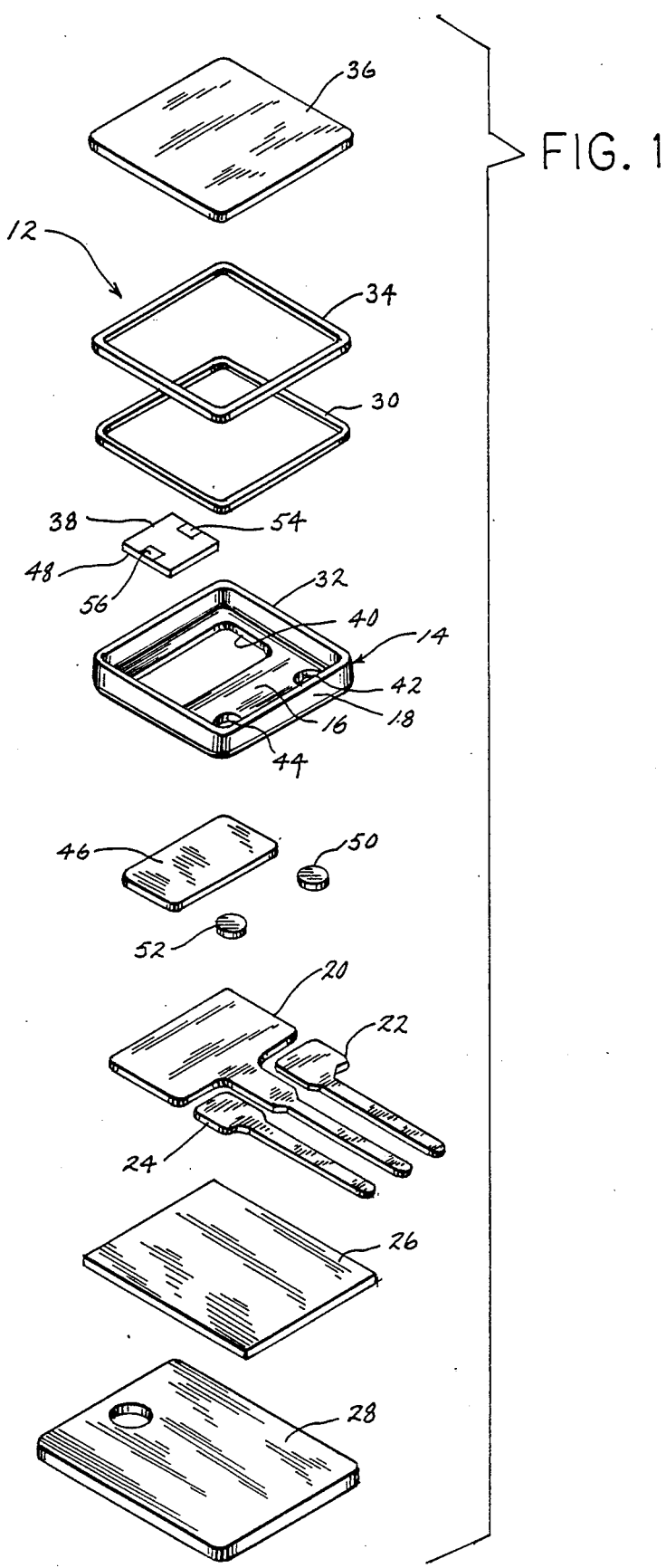
FIG. 1 is an exploded perspective view of an electric circuit assembly in accordance with the invention.
Figure 2:
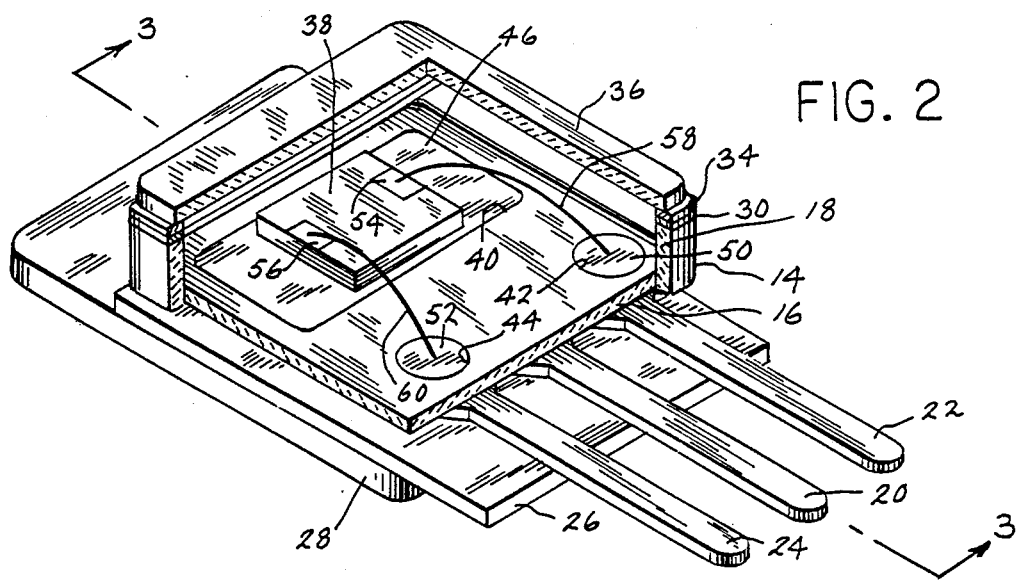
FIG. 2 is an assembled view of the structure of FIG. 1, partially cut away.
Figure 3:
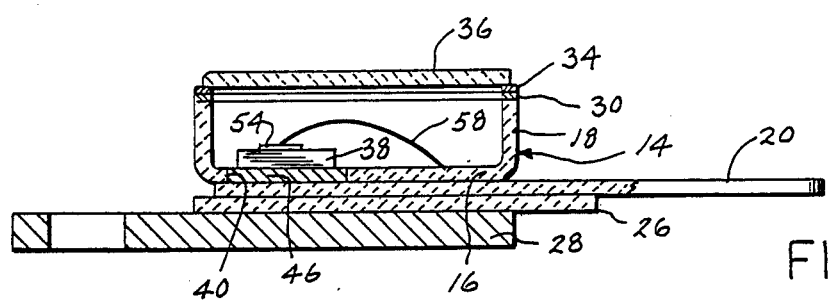
FIG. 3 is a sectional view taken along line 3—3 of FIG. 2.

FIGS. 1-3 show an electric circuit assembly 12. An electrically insulating refractory ceramic tub 14 has a floor 16 and an integral side wall 18 around the perimeter thereof and extending upwardly therefrom. Tub 14 is placed in contact with electrically conductive copper lead frames 20, 22, 24 therebelow, which in turn are placed in contact with electrically insulating refractory ceramic substrate 26 therebelow, which in turn is placed in contact with electrically conductive copper base plate 28 therebelow. A copper ring 30 is placed in contact with the top 32 of side wall 18 of tub 14. A second copper ring 34 is placed in contact with the underside of an electrically insulating refractory ceramic top cover 36.

The assemblies are then directly and hermetically bonded. Copper ring 30, ceramic tub 14, copper lead frames 20, 22, 24, ceramic substrate 26, and copper base plate 28 are placed in the noted contact and heated to a temperature below the melting point of copper ring 30, copper lead frames 20, 22, 24, and copper base plate 28 to form a eutectic with the copper which wets such copper members and the noted ceramic members in contact therewith. The assembly is then cooled, with copper ring 30 bonded to the top 32 of side wall 18 of tub 14 therebelow, and with lead frames 20, 22, 24 bonded to the bottom of floor 16 of tub 14 thereabove, and with lead frames 20, 22, 24 bonded to the top of ceramic substrate 26 therebelow, and with copper base plate 28 bonded to the bottom of ceramic substrate 26 thereabove. The copper members are pre-oxidized, and the assembly is heated in an inert atmosphere, or alternately the assembly is heated in a reactive oxidation atmosphere. For further reference to the direct bonding process, reference is made to the above noted direct bond process patents, incorporated herein by reference. Copper ring 34 is directly and hermetically bonded to the underside of ceramic top cover 36 in like manner. An electrical component provided by semiconductor chip 38 is then mounted in the tub and connected to the lead frames. The top cover 36 is hermetically sealed to the top of the side wall of the tub, by welding rings 30 and 34 to each other.

Tub 14 sits on lead frames 20, 22, 24 with the bottom of floor 16 bonded to the top of the lead frames. Floor 16 has a plurality of apertures 40, 42, 44, therethrough. Semiconductor chip 38 is connected to the lead frames through the apertures. Lead frame 20 has a portion 46 extending upwardly in aperture 40. Portion 46 may be formed by half-etching lead frame 20, for example as shown in U.S. Pat. No. 4,630,174, or portion 46 may be soldered or welded to lead frame 20 and/or directly bonded to the sides of aperture 40. Semiconductor chip 38 has a lower contact pad 48 mounted on portion 46 by solder reflow and in electrical contact with portion 46. Lead frames 22 and 24 have portions 50 and 52 extending upwardly in respective apertures 42 and 44 which likewise may be formed by half-etching, or may be separate pieces welded or soldered to the rest of the lead frame therebelow and/or directly bonded to the sides of the apertures. Semiconductor chip 38 has a pair of upper contact pads 54 and 56 connected by sonically or thermally welded respective jumper leads 58 and 60 to lead frame portions 50 and 52. In the case of a FET chip, lower contact pad 48 is the drain, and upper contact pads 54 and 56 are the source and gate.

Figure 4:
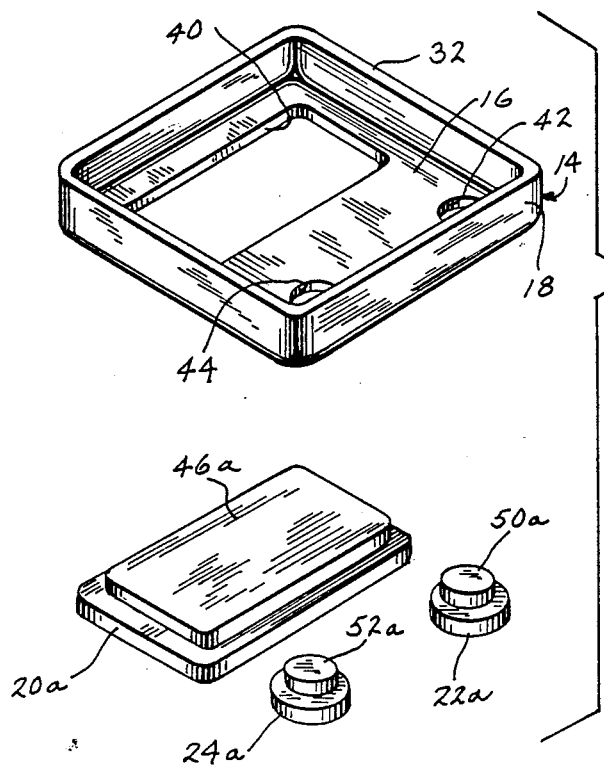
FIG. 4 is an exploded perspective view of an alternate embodiment of a portion of FIG. 1.

FIG. 4 shows an alternate embodiment for a surface mount configuration, without lower ceramic substrate 26 and copper base plate 28. Modified lead frames 20a, 22a, 24a, correspond respectively to lead frames 20, 22, 24, and have respective integral portions 46a, 50a, 52a extending upwardly into apertures 40, 42, 44.

Figure 5:
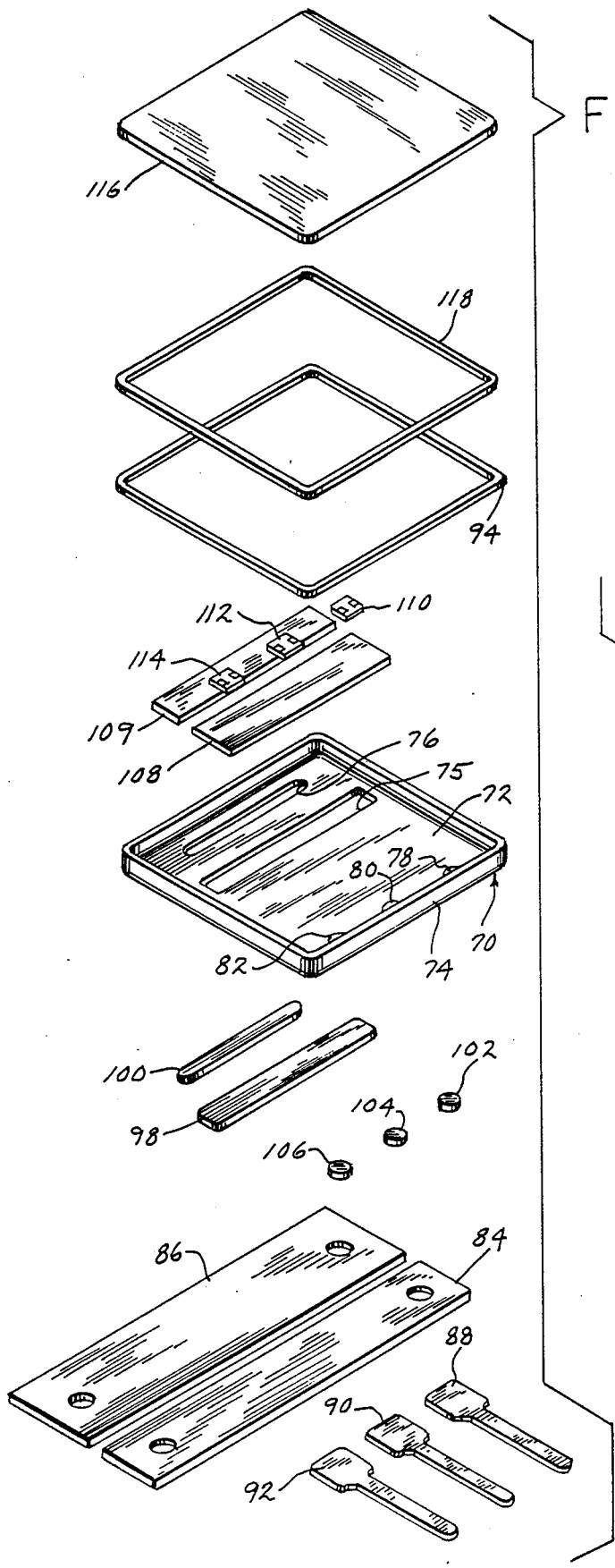
FIG. 5 is an exploded perspective view of an alternate embodiment of an electric circuit assembly in accordance with the invention.

FIGS. 5 and 8 show a further embodiment. Ceramic tub 70 has a floor 72 and an integral side wall 74 around the perimeter thereof and extending upwardly therefrom. Floor 72 has a pair of oblong extended apertures 75 and 76 therethrough and a plurality of gate lead apertures 78, 80, 82 therethrough. The bottom of floor 72 is directly bonded to a pair of flat copper conductor lead frames 84, 86, and gate lead frames 88, 90, 92, therebelow. Copper ring 94 is directly bonded on the top 96 of side wall 74. Lead frames 84, 86, 88, 90, 92 have respective portions 98, 100, 102, 104, 106 extending upwardly in respective apertures 75, 76, 78, 80, 82. A further lead frame portion 108 is provided over aperture 75 on lead frame portion 98 to provide a wider drain contact attachment area for the lower drain contacts of FET chips 110, 112, 114. A further lead frame portion 109 is provided over aperture 76 on lead frame portion 100 to provide a wider contact attachment area for the source lead wires from the FET chips. The FET chips are connected in parallel on portion 108 on portion 98 of drain lead frame 84, with respective jumper wires connected in parallel to portion 109 on portion 100 of source lead frame 86, and with respective gate jumper wires connected to respective portions 102, 104, 106 of gate lead frames 88, 90, 92. Lead frame portion 98 of lead frame 84 is formed by half-etching as noted above, or is a separate piece soldered or welded to lead frame 84 and/or directly bonded to the sides of aperture 75. The remaining lead frame portions are comparably provided. Lead frame portions 108 and 109 are soldered or welded on respective lead frame portions 98 and 100 after the direct bond step, or are placed on respective lead frame portions 98 and 100 over respective apertures 75 and 76 and directly bonded to the top of floor 72. Ceramic top cover 116 has copper ring 118 directly bonded to the underside thereof. Rings 94 and 118 are welded to each other to hermetically seal top cover 116 to tub 70.

Figure 6:
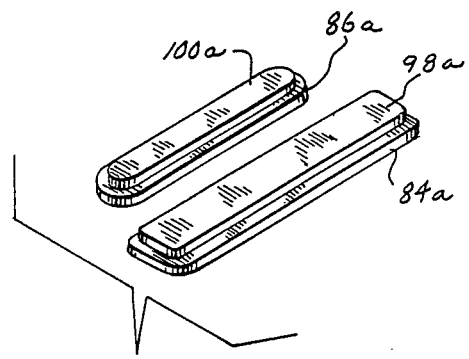
FIG. 6 is a perspective view of an alternate embodiment of a portion of the structure of FIG. 5.

FIG. 6 shows modified lead frames 84a and 86a corresponding respectively to lead frames 84 and 86, and with portions 98a and 100a extending upwardly therefrom and corresponding to portions 98 and 100.

Figure 7:
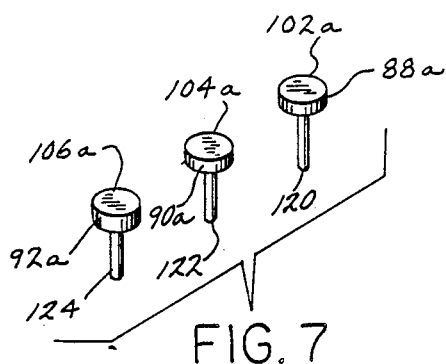
FIG. 7 is a perspective view of an alternate embodiment of a portion of the structure of FIG. 5.

FIG. 7 shows modified gate lead frames 88a, 90a, 92a, corresponding respectively to gate lead frames 88, 90, 92. Gate lead frames 88a, 90a, 92a, have upper head portions 102a, 104a, 106a corresponding respectively to portions 102, 104, 106, and which are received in respective apertures 78, 80, 82, of the floor 72 of tub 70 and directly bonded thereto. Gate lead frames 88a, 90a, 92a, have lower stems 120, 122, 124 extending downwardly therefrom below floor 72 of tub 70.

FIG. 9 shows an assembled view of the structure of FIG. 5, but modified to incorporate the gate lead frames of FIG. 7, and with gate lead frame apertures 78a, 80a, 82a, moved to one side of the tub. For clarity of illustration, simple gating circuitry is shown, though it is within the scope of the invention to include further control gating circuitry within the tub as desired for particular implementations. FIG. 9 shows a single tub 70 which forms the basic building block for the multitub structure of FIG. 10.

FIG. 10 shows a plurality of ceramic tubs 70, 130, 132, 134, 136, 138, 140, 142, 144, 146, 148, 150, stacked on top of each other. Each tub has a floor and an integral side wall around the perimeter thereof and extending upwardly therefrom. Each tub has a pair of flat copper conductor lead frames comparable to lead frames 84 and 86 directly and hermetically bonded thereto as above described. Each tub has a plurality of semiconductor chips therein connected to respective lead frames. Each tub has a top cover comparable to cover 116 hermetically sealed to the top of the side wall of the tub to close the latter and hermetically seal the respective semiconductor chips.

Lead frame 84 has distal end portions 152 and 154 extending laterally oppositely beyond opposite distal sides of tub 70. Lead frame 86 has distal end portions 156 and 158 extending laterally oppositely beyond the opposite distal sides of tub 70. The other comparable lead frames of the other tubs likewise have distal ends extending laterally oppositely beyond the opposite distal sides of the respective tubs. The tubs are held together in stacked relation by mounting bolts, some of which are seen at 160, 162, 164, 166, 168, 170. The mounting bolts engage the lead frames at the laterally extended distal end portions. The mounting bolts extend upwardly along the stack and perpendicularly to the flat lead frames and extend through apertures in the distal ends of the lead frames. The bolts also extend through hollow cylindrical spacers 171 between the lead frames and which have a length about equal to the height of a tub and cover and which space the ends of the lead frames accordingly. The bolts clamp the lead frames and spacers into mechanical and electrical contact. The lead frames are also spaced by the tubs and covers therebetween. The tubs sit on the central portions of the respective lead frames with the bottom of the floor of each tub bonded to the top of the respective pair of lead frames. The tubs are spaced by the lead frames therebetween. Additional spacers may be provided between the tub cover and the next lead frame thereabove, with accordingly longer spacers at the ends of the lead frames, if a larger gap is desired for cooling purposes, e.g. for air or liquid flow therethrough. Gate lead frame stems such as 120, 122, 124, are connected to respective conductor strip patterns 172, 174, 176, on an insulating film 178. The particular electrical contact connection pattern in FIG. 9 is an H-bridge with each tub having three semiconductor switches connected in parallel and in parallel with the three chips in each of two other tubs. Gating strip 178 and its conductive strips are connected to the gate lead frame stems for tubs 70, 130 and 132. Tubs 70, 130 and 132 provide one leg of the H-bridge. A second leg of the H-bridge is provided by tubs 134, 136, 138. A third leg of H-bridge is provided by tubs 140, 142, 144. The fourth leg of the H-bridge is provided by tubs 146, 148, 150. Bolts 166 and 168 are connected to the load. Bolts 164 and 170 are connected to the AC source. Other stacked structures may of course be constructed. Each tub and cover is an individual hermetic package. The packages are mechanically supported and electrically connected by the bolts and spacers.

It is recognized that various equivalents, alternatives and modifications are possible within the scope of the apended claims.

I claim:

1. An electric circuit assembly comprising:
   an electrically insulating refractory tub having a floor and an integral side wall around the perimeter thereof and extending upwardly therefrom;
   electrically conductive metallic lead frames directly and hermetically bonded to said tub by placing said lead frames in contact with said tub, heating said lead frames and said tub to a temperature below the melting point of said lead frames to form a eutectic with said lead frames which wets said lead frames and said tub, and cooling said lead frames and said tub, with said lead frames bonded to said tub;
   an electrical component in said tub connected to said lead frames;
   a top cover hermetically sealed to the top of said side wall to close said tub and hermetically seal said electrical component therein, wherein said cover is an electrically insulating refractory member;
   a first metallic ring directly and hermetically bonded to the top of said side wall of said tub by placing said first ring in contact with said top of said side wall, heating said ring and said tub to a temperature below the melting point of said ring to form a eutectic with said ring which wets said ring and said top of said side wall of said tub, and cooling said ring and said tub, with said ring bonded to said top of said side wall of said tub;
   a second metallic ring directly and hermetically bonded to said top cover by placing said second ring in contact with said top cover, heating said second ring and said top cover to a temperature below the melting point of said second ring to form a eutectic with said second ring which wets said second ring and said top cover, and cooling said second ring and said top cover, with said second ring bonded to said top cover;
   and wherein said rings are welded to each other.

2. The invention according to claim 1, wherein said tub sits on said lead frames, with the bottom of said floor of said tub bonded to the top of said lead frames, and wherein said floor has a plurality of apertures therethrough and wherein said electrical component is connected to said lead frames through said apertures.

3. The invention according to claim 2, wherein a first of said lead frames has a portion extending upwardly in a first of said apertures, and wherein said electrical component has a lower contact pad mounted on and in electrical contact with said upwardly extending portion of said first lead frame.

4. The invention according to claim 3, wherein a second and third of said lead frames each have a portion extending upwardly in respective second and third said apertures, and wherein said electrical component has a pair of upper contact pads connected by respective jumper leads to said upwardly extending portions of respective said second and third lead frames.

5. An electric circuit assembly comprising:
   an electrically insulating refractory tub having a floor with a plurality of apertures therethrough and an integral side wall around the perimeter thereof and extending upwardly therefrom;
   electrically conductive metallic lead frames including a pair of flat conductors extending beneath said tub and directly and hermetically bonded thereto to hermetically seal said apertures, by placing said conductors in contact with said tub, heating said conductors and said tub to a temperature below the melting point of said conductors to form a eutectic with said conductors which wets said conductors and said tub, and cooling said conductors and said tub, with said conductors bonded to said tub;
   one or more electrical components in said tub connected to said conductors through said apertures;
   a top cover hermetically sealed to the top of said side wall of said tub to close said tub and hermetically seal said electrical components therein, wherein said cover is an electrically insulating refractory member;
   wherein each said conductor has a portion bonded to the bottom of said floor of said tub and an end portion extending laterally beyond said tub, and wherein said apertures are oblong and extend along the extension of said flat conductors, and comprising a plurality of said electrical components each having a lower contact pad electrically connected to one of said flat conductors at one of said oblong apertures, and having an upper contact pad connected by a respective jumper lead to the other conductor at the other oblong aperture, such that said plurality of electrical components are electrically connected in parallel between said conductors,
   a first metallic ring directly and hermetically bonded to the top of said side wall of said tub by placing said first ring in contact with said top of said side wall of said tub, heating said first ring and said tub to a temperature below the melting point of said first ring to form a eutectic with said first ring which wets said first ring and said tub, and cooling said first ring and said tub with said first ring bonded to said top of said side wall of said tub;
   a second metallic ring directly and hermetically bonded to said top cover by placing said second ring in contact with said top cover, heating said second ring and said top cover to a temperature below the melting point of said second ring to form a eutectic with said second ring which wets said second ring and said top cover and cooling said second ring and said top cover, with said second ring bonded to said top cover;
   and wherein said rings are welded to each other.

6. An electric circuit assembly comprising:
   a plurality of electrically insulating refractory tubs stacked on top of each other, each tub having a floor and an integral side wall around the perimeter thereof and extending upwardly therefrom;
   electrically conductive metallic lead frames directly and hermetically bonded to said tubs by placing said lead frames in contact with said tubs, heating said lead frames and said tubs to a temperature below the melting point of said lead frames to form a eutectic with said lead frames which wets said lead frames and said tubs, and cooling said lead frames and said tubs, with said lead frames bonded to said tubs;
   a plurality of electrical components, at least one in each said tub connected to respective said lead frames;
   a plurality of top covers, each hermetically sealed to the top of said side wall of the respective said tub to close the latter and hermetically seal said respective electrical component therein, wherein
   said lead frames have portions extending laterally beyond said tubs and wherein said tubs are held in stacked relation by mounting structure engaging said lead frames at said laterally extending portions, said lead frames have distal end portions extending laterally oppositely beyond opposite distal sides of said tubs, said mounting structure comprises spacers between said lead frame distal end portions, and bolts extending upwardly along the stack and perpendicularly through said lead frame distal end portions and through said spacers and clamping said lead frames and said spacers into mechanical and electrical contact.

7. The invention according to claim 6 wherein said lead frames are spaced by said tubs and covers therebetween.

8. The invention according to claim 7 wherein:

said tubs sit on central portions of said lead frames, with the bottom of said floor of a respective said tub bonded to the top of a respective said central portion of a respective said lead frame;

said floors have apertures therethrough;

said electrical components are connected to said lead frames through said apertures;

said tubs are spaced by said lead frames therebetween.

9. The invention according to claim 8 wherein said lead frames comprise a pair of flat conductors for each said tub, each flat conductor having a central portion bonded to said bottom of said floor of the respective said tub, and having distal end portions extending laterally oppositely beyond opposite distal sides of said respective tub.

10. The invention according to claim 9 wherein said lead frames further comprise a gating lead frame for each tub bonded to said floor and connected through an aperture in said floor to said electrical component.

11. An electric circuit assembly comprising:

a plurality of electrically insulating refractory tubs stacked on top of each other, each tub having a floor and an integral side wall around the perimeter thereof and extending upwardly therefrom;

electrically conductive metallic lead frames directly and hermetically bonded to said tubs by placing said lead frames in contact with said tubs, heating said lead frames and said tubs to a temperature below the melting point of said lead frames to form a eutectic with said lead frames which wets said lead frames and said tubs, and cooling said lead frames and said tubs, with said lead frames bonded to said tubs;

a plurality of electrical components, at least one in each said tub connected to respective said lead frames;

a plurality of top covers, each hermetically sealed to the top of said side wall of the respective said tub to close the latter and hermetically seal said respective electrical component therein, wherein said lead frames have portions extending laterally beyond said tubs and wherein said tubs are held in stacked relation by mounting structure engaging said lead frames at said laterally extending portions, said lead frames have distal end portions extending laterally oppositely beyond opposite distal sides of said tubs, said lead frames are spaced by said tubs and covers therebetween, said tubs sit on central portions of said lead frames, with the bottom of said floor of a respective said tub bonded to the top of a respective said central portion of a respective said lead frame;

said floors have apertures therethrough;

said electrical components are connected to said lead frames through said apertures;

said tubs are spaced by said lead frames therebetween, said lead frames comprise a pair of flat conductors for each said tub, each flat conductor having a central portion bonded to said bottom of said floor of the respective said tub, and having distal end portions extending laterally oppositely beyond opposite distal sides of said respective tub, said mounting structure comprises a plurality of bolts extending perpendicularly through said distal end portions of said flat conductors in a given electrical contact connection pattern in clamping relation.

12. A method for making an electric circuit assembly comprising:

providing an electrically insulating refractory tub having a floor and an integral side wall around the perimeter thereof and extending upwardly therefrom;

providing electrically conductive metallic lead frames;

directly and hermetically bonding said lead frames to said tub by placing said lead frames in contact with said tub, heating said lead frames and said tub to a temperature below the melting point of said lead frames to form a eutectic with said lead frames which wets said lead frames and said tub, and cooling said lead frames and said tub with said lead frames bonded to said tub;

providing an electrical component in said tub and connecting said component to said lead frames;

providing a top cover and hermetically sealing said top cover to the top of said side wall of said tub to close said tub and hermetically seal said electrical component therein, wherein said cover is an electrically insulating refractory member;

providing a first metallic ring;

directly and hermetically bonding said first ring to the top of said side wall of said tub by placing said first ring in contact with said top of said side wall of said tub, heating said first ring and said tub to a temperature below the melting point of said first ring to form a eutectic with said first ring which wets said first ring and said top of said side wall of said tub, and cooling said first ring and said tub, with said first ring bonded to said top of said side wall of said tub;

providing a second metallic ring;

directly and hermetically bonding said second ring to said top cover by placing said second ring in contact with said top cover, heating said second ring and said top cover to a temperature below the melting point of said second ring to form a eutectic with said second ring which wets said second ring and said top cover, and cooling said second ring and said top cover with said second ring bonded to said top cover;

welding said rings to each other to hermetically seal said top cover to said top of said side wall of said tub.

13. The invention according to claim 12 wherein said tub sits on said lead frames with the bottom of said floor of said tub bonded to the tops of said lead frames, and wherein said floor has a plurality of apertures therethrough, and comprising placing said lead frames in contact with said bottom of said floor of said tub to cover said apertures from below and hermetically seal same during said direct bonding step, and comprising connecting said electrical component to said lead frames through said apertures.

14. The invention according to claim 13 wherein the first of said lead frames has a portion extending upwardly in a first of said apertures, and comprising mounting said electrical component on and in electrical contact with said upwardly extending portion of said first lead frame.

* * * * *